(12) United States Patent
Douriet et al.

(10) Patent No.: US 8,722,536 B2
(45) Date of Patent: *May 13, 2014

(54) FABRICATION METHOD FOR CIRCUIT SUBSTRATE HAVING POST-FED DIE SIDE POWER SUPPLY CONNECTIONS

(71) Applicant: International Business Machines Corporation, Armonk, NY (US)

(72) Inventors: Daniel Douriet, Round Rock, TX (US); Francesco Preda, New Braunfels, TX (US); Brian L. Singletary, Austin, TX (US); Lloyd A. Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/959,003

(22) Filed: Aug. 5, 2013

(65) Prior Publication Data
US 2013/0316534 A1 Nov. 28, 2013

Related U.S. Application Data

(60) Continuation of application No. 12/874,397, filed on Sep. 2, 2010, now Pat. No. 8,586,476, which is a division of application No. 12/029,574, filed on Feb. 12, 2008, now Pat. No. 7,863,724.

(51) Int. Cl.
*H01L 21/44* (2006.01)
(52) U.S. Cl.
USPC .......... 438/667; 438/618; 438/622; 438/624; 438/625; 438/666; 438/674; 438/675

(58) Field of Classification Search
USPC ......... 438/618, 622, 624, 625, 666, 667, 674, 438/675
See application file for complete search history.

(56) References Cited

U.S. PATENT DOCUMENTS

| 5,691,568 | A | 11/1997 | Chou et al. |
| 6,137,168 | A | 10/2000 | Kirkman |
| 6,388,207 | B1 | 5/2002 | Figueroa et al. |
| 6,452,117 | B2 | 9/2002 | Curcio et al. |

(Continued)

OTHER PUBLICATIONS

Notice of Allowance in U.S. Appl. No. 12/874,397 mailed on Jul. 15, 2013 (pp. 1-8 in pdf).

(Continued)

*Primary Examiner* — Bac Au
(74) *Attorney, Agent, or Firm* — Mitch Harris, Atty at Law, LLC; Andrew M. Harris; Matthew W. Baca

(57) ABSTRACT

A circuit substrate uses post-fed top side power supply connections to provide improved routing flexibility and lower power supply voltage drop/power loss. Plated-through holes are used near the outside edges of the substrate to provide power supply connections to the top metal layers of the substrate adjacent to the die, which act as power supply planes. Pins are inserted through the plated-through holes to further lower the resistance of the power supply path(s). The bottom ends of the pins may extend past the bottom of the substrate to provide solderable interconnects for the power supply connections, or the bottom ends of the pins may be soldered to "jog" circuit patterns on a bottom metal layer of the substrate which connect the pins to one or more power supply terminals of an integrated circuit package including the substrate.

14 Claims, 4 Drawing Sheets

(56) References Cited

U.S. PATENT DOCUMENTS

| | | |
|---|---|---|
| 6,489,682 B1 | 12/2002 | Yeh et al. |
| 6,528,872 B2 | 3/2003 | Chang |
| 6,577,013 B1 | 6/2003 | Glenn et al. |
| 6,611,419 B1 | 8/2003 | Chakravorty |
| 6,650,014 B2 | 11/2003 | Kariyazaki |
| 6,900,544 B2 | 5/2005 | Boireau |
| 6,941,537 B2 | 9/2005 | Jessup et al. |
| 6,943,450 B2 | 9/2005 | Fee et al. |
| 6,967,398 B2 | 11/2005 | Frech et al. |
| 7,002,075 B2 | 2/2006 | Kambe et al. |
| 7,030,502 B2 | 4/2006 | Chang |
| 7,035,081 B2 | 4/2006 | Nagata et al. |
| 7,081,650 B2 | 7/2006 | Palanduz et al. |
| 7,120,031 B2 | 10/2006 | Chakravorty et al. |
| 7,217,370 B2 | 5/2007 | Sugimoto et al. |
| 7,298,036 B2 | 11/2007 | Miller et al. |
| 8,586,476 B2 * | 11/2013 | Douriet et al. ............... 438/667 |
| 2007/0230150 A1 | 10/2007 | Castriotta et al. |
| 2008/0142258 A1 | 6/2008 | Caletka et al. |

OTHER PUBLICATIONS

Office Action in U.S. Appl. No. 12/874,397 mailed on Mar. 22, 2013 (pp. 1-9 in pdf).

Notice of Allowance in U.S. Appl. No. 12/029,574 mailed on Aug. 24, 2010 (pp. 1-9 in pdf).

* cited by examiner

FABRICATION METHOD FOR CIRCUIT SUBSTRATE HAVING POST-FED DIE SIDE POWER SUPPLY CONNECTIONS

This U.S. patent application is a Continuation of U.S. patent application Ser. No. 12/874,397, filed on Sep. 2, 2010, which is a Division of U.S. patent application Ser. No. 12/029, 574, filed on Feb. 12, 2008, and issued as U.S. Pat. No. 7,863,724 on Jan. 4, 2011. All of the above-referenced U.S. patent applications are incorporated herein by reference.

BACKGROUND

1. Technical Field

The present invention relates generally to integrated circuit power supply distribution, and more particularly, to a methodology and substrate that has reduced power supply resistance from external power supply terminals to the die power supply connections.

2. Description of the Related Art

High-density interconnect schemes for processor packages, as well as other very-large-scale integrated (VLSI) circuits, typically use a large number of circuit layers to connect one or more dies to electrical terminals disposed on one or more surfaces of the package, as well as to interconnect multiple dies in multi-die packages. Power distribution in packages having bottom-side terminals and top side die mounting is typically performed by including multiple v cias connecting power supply terminals of the one or more dies to power supply planes that are disposed at metal layers at or near the bottom of the substrate. In packages having no power supply planes, power supply distribution is generally accomplished using vias extending from the die power supply terminals to the package terminals.

When distributing power to dies such as those including one or more processors, a very low resistance path from the power supply terminals to the die is a requirement. Present-day VLSI integrated circuits such as processors, can require power supply currents in excess of 100 amperes and operate at power supply voltages of less than one volt. A net power supply path resistance of 0.005 milliohms will result in a power dissipation of 50 Watts under such conditions, which is 50% of the total power consumption. The resulting drop in voltage would require a 2 volt power supply to deliver 1 volt at the die.

Therefore, large numbers of commonly-connected die terminals, vias and package terminals are included for each power supply connection (including return paths such as ground), to ensure that the overall resistance of each power supply path does not result in substantial power loss and voltage drop. The vias are typically placed under the die and/or near the edges of the die, to reduce the power supply path resistance.

However, such power supply distribution consumes routing resources that could otherwise be utilized for routing signal paths, thereby increasing the size, weight, cost and complexity of the substrate and package. Further, inclusion of power supply vias near or under the die to decrease path resistance either requires placement of decoupling capacitors adjacent to the die, or placement of wide conductors extending to the decoupling capacitors further away from die, limiting critical signal routing resources near the edges of the die. Resources are further limited since manufacturing processes limit the number of layers a via can transit before requiring a "jog" or lateral displacement. The vias for power supplies are numerous and/or larger that signal vias in order to decrease resistance, and therefore the requirement to place power supply vias under or near the die drastically reduces the signal routing resources that would otherwise be available.

Therefore, it is desirable to provide a substrate for an integrated circuit package, and a method for making a substrate for an integrated circuit package, that frees up routing resources in the vicinity of the die(s) by routing power supply connections from the die(s) to external terminals in regions away from the die(s).

BRIEF SUMMARY

The objective of freeing routing resources in the vicinity of the die(s) of an integrated circuit package is achieved in an integrated circuit substrate, and methods for making the integrated circuit substrate.

The substrate includes a pair of top metal layers separated by an insulating layer, that form power supply planes for supplying power supplies to a die. Power supply lands for connecting the power supplies to the die are disposed on a top metal plane, and include connected lands for a first power supply plane and isolated lands for a second power supply plane. Small-diameter blind vias are formed from the inner one of the top metal layers to the isolated lands. Large-diameter plated-through structures, e.g., plated-through holes, are formed near edges of the substrate and are electrically connected to a corresponding one of the top or inner metal layers. Power supply terminals are provided at the bottom of the substrate, which may be terminal lands connected by jogs to the bottoms of the plated-through structures, or may be extensions of a conductive pin inserted through the plated-through structures forming solderable power supply leads at the bottom of the substrate.

A plurality of conductive vias may be formed around the plated-through structure, to decrease the resistance from the bottom of the plated-through structure to the top, as well as to form improve connections to the top and inner metal power supply planes.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying Figures, wherein like reference numerals indicate like components, and:

DETAILED DESCRIPTION

The present invention concerns integrated circuit package substrates and methods of designing and making the substrates that provide improved power supply terminal coupling to the die. The resistance of the power supply connection paths is decreased by forming large-diameter plated-through holes near the edges of the substrate, and using them to provide power supply voltages to metal power plane layers at the top of the substrate. The large-diameter plated-through holes may be paste-filled or conductive pins may be inserted through the plated-through holes to further decrease resistance from the power supply terminals of the integrated circuit to the power planes. Power from the top of the large-diameter plated-through holes is transferred to the top metal power plane layer and the inner metal power plane layer(s) by the plated-through holes themselves, along with additional small diameter vias disposed around the central plated-through holes, which increase the effective area of contact to the metal power planes, as well as decreasing the overall resistance of the vertical structure. The power supply terminals may be directly provided by the conductive pins, by providing the conductive pins as solderable pins extending below the bottom surface of the substrate. Power supply connections to the die are made by lands formed on the top metal power supply plane and lands that are not connected to the top metal power supply are fed by small-diameter blind vias from the metal layer beneath that forms the other supply plane. While the illustrated embodiment depicted herein is directed toward substrates and integrated circuits having two power supply planes, additional power supply planes may be added beneath the top two power supply planes and additional plated-through structures added to supply their corresponding power supply voltages.

Figure 1A:
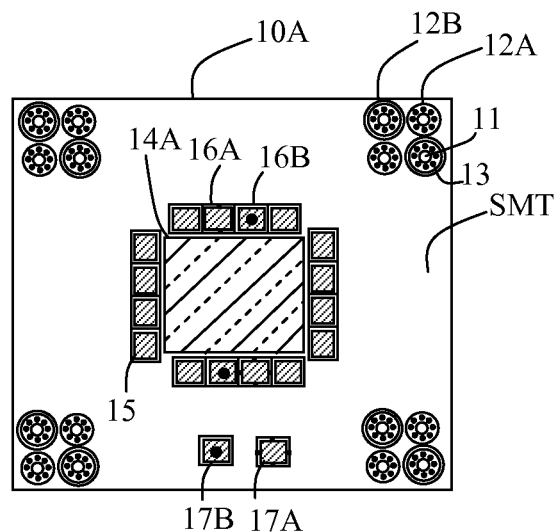
FIG. 1A is a top view of an integrated circuit in accordance with an embodiment of the present invention.

Referring now to FIG. 1A, a top view of an integrated circuit in accordance with an embodiment of the present invention is shown. A die 14A is mounted on a substrate 10A. Electrical connections to the die are made from a plurality of lands including power supply lands 16A, 16B, generally by bond wires (not shown) extending from the plurality of lands to terminals of the die. Power supply land 16A illustrates a "connected" land, that includes metal stubs extending to the power plane forming the bulk of the metal layer on which the plurality of lands are formed, which lies beneath the top soldermask SMT. Power supply land 16B illustrates an "isolated" land, which is connected to the other metal power supply plane layer by a small-diameter conductive blind via. Signal lands 15 are also isolated lands and are also connected by vias to signal layers disposed underneath the power plane layers. Locating the power planes at the top of the stack forming substrate 10A reduces resistance of power supply connections substantially, as the length of small-diameter vias required to connect from power supply terminals of die 14A to the power planes is shortened substantially. Away from die 14A, near the edges of substrate 10A large-diameter plated-through structures 12A, 12B are formed to connect power supply terminals at the bottom side of substrate 10A to the top metal power planes. Plated-through structure 12A illustrates a connected plated-through structure, which has a top end formed on or partially within the top metal power plane layer and is electrically connected thereto. Plated-through structure 12B illustrates an isolated plated-through structure, which has a top end formed on or partially within the inner metal power plane layer and is electrically connected thereto. In the exemplary embodiment, a plurality of conductive small-diameter vias 13 are disposed around a central plated-through hole 11 in a circular pattern. Small-diameter vias 13 improve the connection between plated-through hole 11 and the metal power planes, and assist in lowering the overall resistance from the bottom end of plated-through structure 12A to the top end. Since the area of contact of the corresponding metal power plane layer with plated-through hole 11 and small-diameter vias 13 is the product of the thickness of the metal power plane layer with the sum of the circumference of each of plated-through hole 11 and small-diameter vias 13, inclusion of small-diameter vias 13 decreases the resistance from the tops of plated-through structures 12A,12B to their corresponding metal power planes. Additional decoupling capacitor lands 17A, 17B, of which one exemplary pair is shown, are disposed atop substrate 10A, and similar to power supply lands 16A, 16B include connected decoupling capacitor land 17A connected to the top power supply plane, and isolated decoupling capacitor land 17B connected to the inner power supply plane by a small-diameter conductive blind via.

Figure 1B:
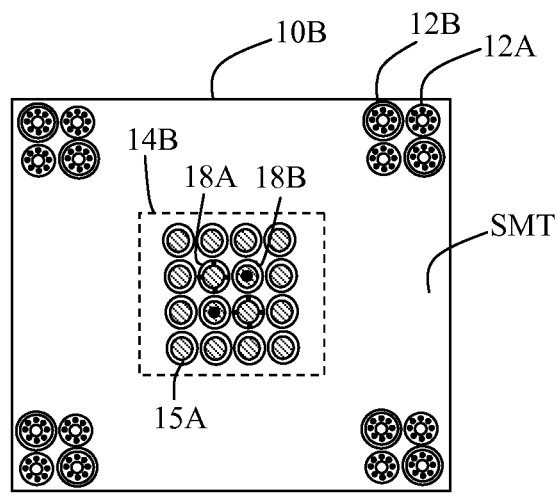
FIG. 1B is a top view of an integrated circuit in accordance with another embodiment of the present invention.

Referring now to FIG. 1B, a top view of an integrated circuit in accordance with another embodiment of the invention is shown. The integrated circuit of FIG. 1B is similar to the integrated circuit of FIG. 1A, and therefore only differences between them will be described below. A die 14B is mounted on a substrate 10B over the die interconnect structure, and is mounted to a plurality of lands by solder bumps or posts. The plurality of lands includes power supply lands 18A,18B which includes connected power supply lands 18A and isolated power supply lands 18B. Signal lands 15A are also provided under die 14B.

Figure 2A:
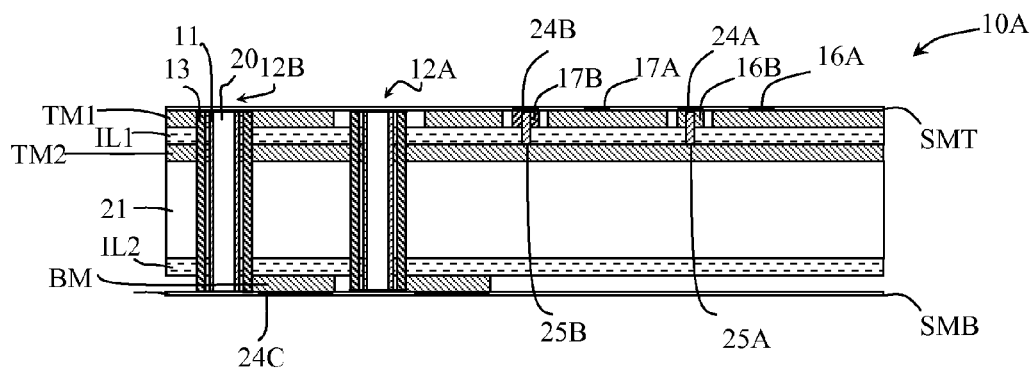
FIG. 2A is a cross-sectional view of a portion of substrate 10A of FIG. 1A, in accordance with an embodiment of the present invention.

Referring now to FIG. 2A, a cross-section of substrate 10A of FIG. 1A, which is also illustrative of substrate 10B of FIG. 1B, is shown in accordance with an embodiment of the invention. Top metal layer TM1 forms the top power supply plane and is connected to plated-through structure 12B at ends of small-diameter vias 13 and plated-through hole 11. Plated-through structure 12A is similarly connected to inner metal layer TM2, which forms the inner power supply plane. Top metal layer TM1 and inner metal layer TM2 are adjacent, but separated by an insulating layer IL1, and effectively form a capacitor that can provide improved decoupling of power supply voltages connected to metal layers TM1 and TM2. A number of signal layers and interposed insulating layers are included in an inner section 21 of substrate 10A and are laminated beneath inner metal layer TM2 and a bottom metal layer BM separated from the last metal layer in inner section 21 by another insulating layer IL2. Bottom metal layer BM includes terminal lands 24C and jogs that connect terminal lands 24C to plated-through structures 12A and 12B. A bottom soldermask SMB includes voids for attachment of solderballs or contact by "fuzz buttons" to lands 24C.

Atop substrate 10A, decoupling capacitor lands 17A, 17B and die power supply lands 16A, 16B are formed in top metal layer TM1, and include a plated surface for die-attach. Solder mask SMT has voids above lands 16A, 16B, 17A, 17B, as well as above plated-through structures 12A, 12B. As mentioned above, isolated lands 16B,17B are connected by corresponding small-diameter blind vias 25A, 25B to inner metal power supply layer TM2. Connected lands 16A, 17A are connected directly to other portions of top metal layer TM1 by stubs formed between relief regions included around the lands.

Figure 2B:
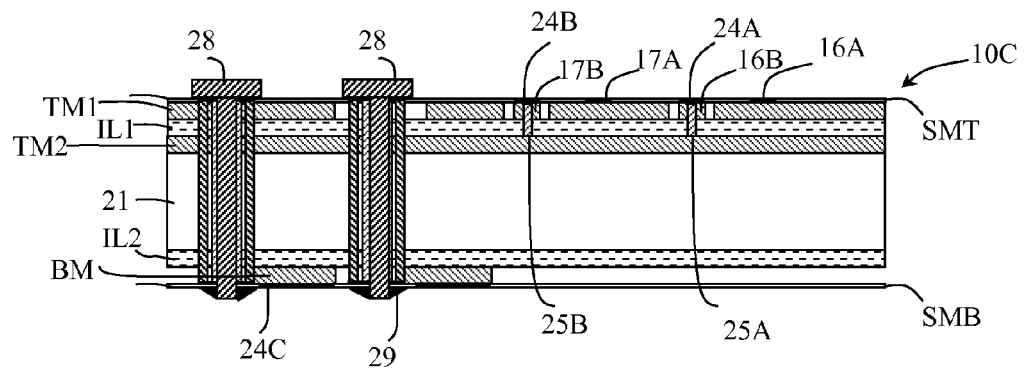
FIG. 2B is cross-sectional view of a substrate in accordance with another embodiment of the present invention.

Referring now to FIG. 2B, a cross-section of a substrate 10C, is shown in accordance with another embodiment of the present invention. Substrate 10C is similar to substrate 10A as illustrated in FIG. 2A and therefore only differences between them will be described below. Substrate 10C includes conductive pins 28 inserted through plated-through structures 12A and 12B, which are attached by solder 29 or other electromechanical attachment to pads in bottom metal layer BM that connected to terminal lands 24C. Conductive pins 28 can also be soldered or otherwise bonded to the top ends plated-through structures 12A and 12B to further improve electrical connection.

Figure 2C:
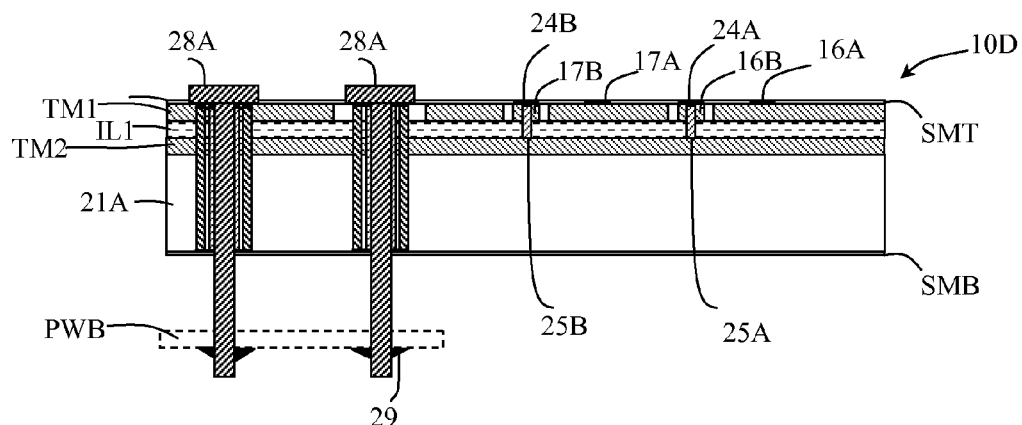
FIG. 2C is cross-sectional view of a substrate in accordance with yet another embodiment of the present invention.

Referring now to FIG. 2C, a cross-section of a substrate 10D, is shown in accordance with another embodiment of the present invention. Substrate 10D is similar to substrate 10C as illustrated in FIG. 2B and therefore only differences between them will be described below. Substrate 10D includes longer conductive pins 28A inserted through plated-through structures 12A and 12B, which are attached by solder 29 to pads on a circuit board PWB, thereby providing the power supply terminals directly, freeing up area that would otherwise be required by terminal lands such as terminal lands 24C of FIG. 2B. Inner section 21A therefore is not required to include power supply lands. Conductive pins 28A can also be soldered or otherwise bonded to the top ends plated-through structures 12A and 12B to further improve electrical connection.

Figure 3A:
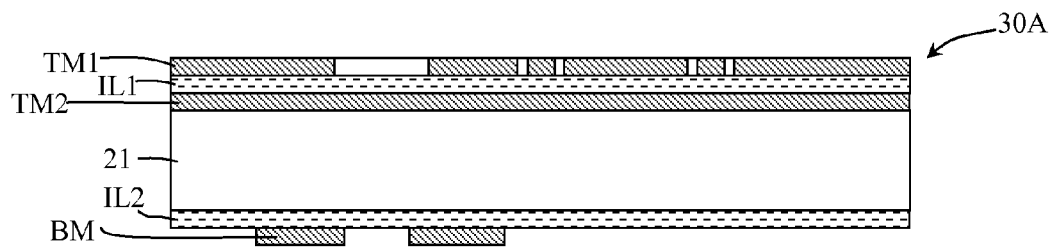
FIGS. 3A-3F are cross-sectional views illustrating steps in the manufacture of a substrate in accordance with an embodiment of the present invention.
Figure 3B:
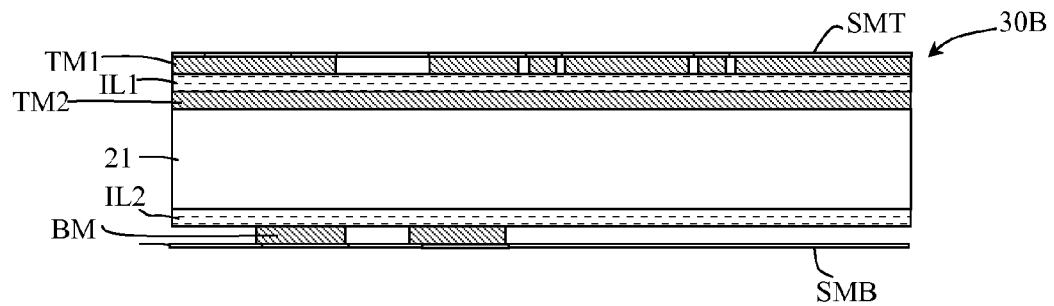
Figure 3C:
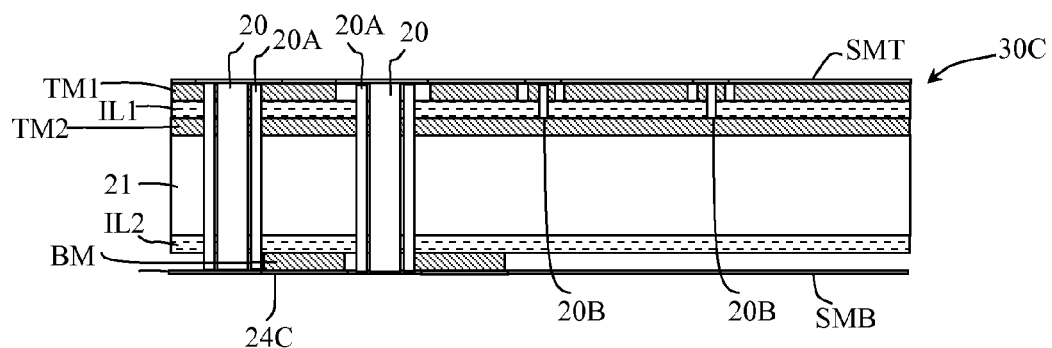

Referring now to FIGS. 3A-3F, a method of making an integrated circuit substrate and an integrated circuit in accordance with an embodiment of the invention is shown. Referring to FIG. 3A, layers of metal and insulator are laminated together by a plating, die-cut. paste screening or other suitable process, where the layers include top metal layer TM1, insulating layer IL1, inner metal layer TM2, inner section 21, insulating layer IL2 and bottom metal layer BM having structures as described above to form substrate step 30A. Next, as shown in FIG. 3B, soldermasks SMT and SMB are applied to substrate step 30A to form substrate step 30B. Soldermasks SMT and SMB may alternatively be applied later in the fabrication process. Through holes 20 and via holes 20A are drilled through substrate step 30B and blind via cavities 20B are also formed, if they have not been formed previous to lamination, resulting in substrate step 30C as shown in FIG. 3C. Since blind via cavities 20B are only required to transit one circuit layer and one insulating layer, they may be formed during the formation of substrate step 30A, or previously if the layers are die-cut or otherwise formed prior to lamination.

Figure 3D:
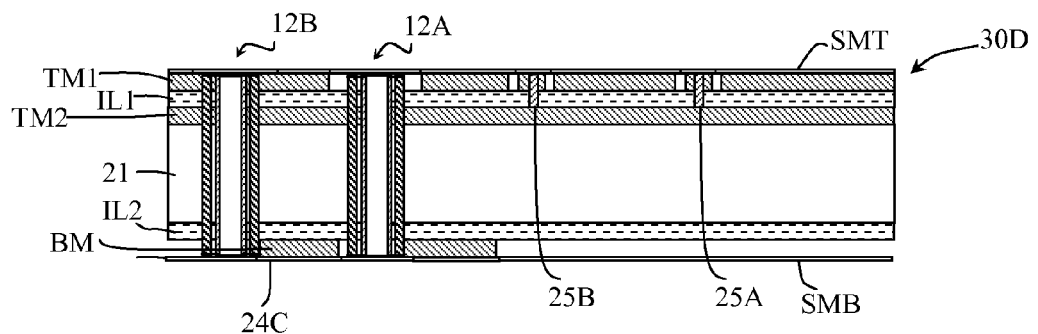
Figure 3E:
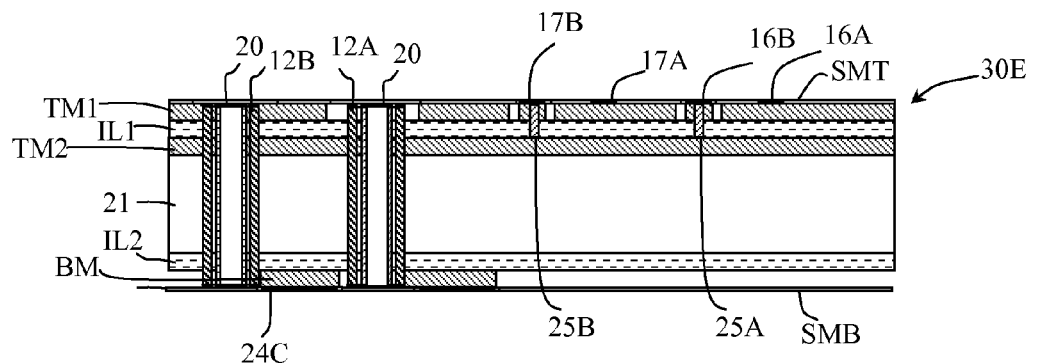
Figure 3F:
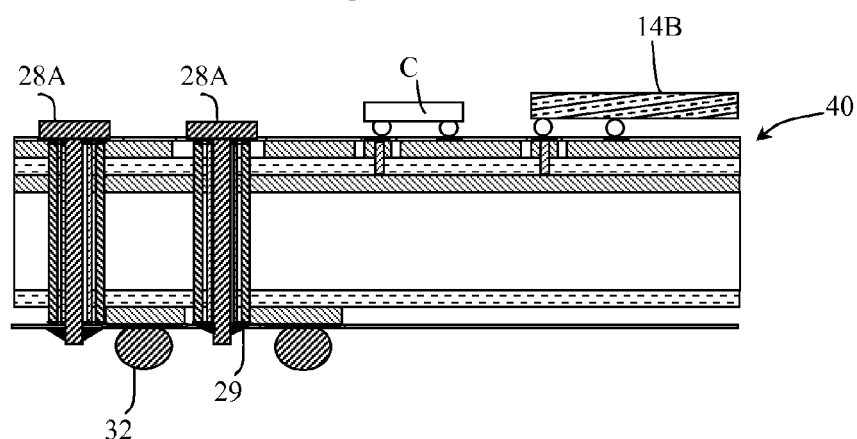

Next, referring to FIG. 3D, holes 20 (FIG. 3C) are plated and via holes 20A (FIG. 3C) are filled by plating or pasting, forming plated-through structure 12B. Also, blind via cavities 20B (FIG. 3C) are filled, resulting in substrate step 30D. Then, as shown in FIG. 3E, lands 17A, 17B, 16A and 16B are plated with a material compatible with the die-attach and capacitor-attach processes. Terminal lands 24C are also plated, forming substrate 30E. Finally, decoupling capacitor C, die 14B and solder balls 32 are attached to substrate 30E, and conductive pins 28A are inserted and attached with solder 29 to form an integrated circuit 40 of FIG. 3F. Substrate 30E of FIG. 3E and FIG. 3F corresponds generally to substrate 10B of FIG. 2B. Fabrication of substrates and integrated circuits such as those illustrated in FIG. 2A and FIG. 2C are similar, and is understood with reference to FIGS. 3A-3F and the description above, with insertion of longer conductive pins 28 substituted for conductive pins 28A and fabrication of terminal lands 24C omitted for fabrication of substrate 10C of FIG. 2C, or omission of conductive pins altogether for the fabrication of substrate 10A of FIG. 2A.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method of making an integrated circuit substrate, comprising:
    laminating a plurality of metal circuit layers between insulating layers, wherein a top two of the metal circuit layers are power supply planes, and wherein a top one of the metal circuit layers includes power supply lands for connecting power supplies to a die, wherein a first plurality of the power supply lands have contiguous connection to the power supply plane formed by the top metal circuit layer;
    forming small-diameter blind vias between an inner one of the top two metal circuit layers and a second plurality of the power supply lands;
    forming large-diameter holes near edges of the substrate;
    plating a first plurality of the holes from the bottom of the substrate to the top metal circuit layer to form first large-diameter plated-through holes;
    plating a second plurality of the holes from the bottom of the substrate to the inner metal circuit layer to form second large-diameter plated-through holes;
    forming a plurality of small-diameter conductive vias proximate to and surrounding the holes; and
    providing terminals electrically connected to the bottoms of the first and second large-diameter plated-through holes to form power supply terminals of the substrate.

2. The method of claim 1, wherein the providing terminals comprises forming a metal circuit layer at the bottom of the substrate having jogs extending from the bottoms of the first and second plated-through holes to provide power supply lands.

3. The method of claim 1, wherein the top one of the metal circuit layers includes connected lands for attaching at least one first terminal of a decoupling capacitor and isolated lands for attaching at least one second terminal of the decoupling capacitor, and further comprising forming decoupling capacitor blind vias extending from the inner metal circuit layer to the isolated lands.

4. The method of claim 1, further comprising inserting conductive pins through the first and second large-diameter plated-through holes and electrically bonding the conductive pins to a corresponding one of the first or second plated-through holes.

5. A method of making an integrated circuit substrate, comprising:
    forming a laminated substrate having multiple metal circuit layers, wherein a top two of the metal circuit layers are power supply planes, wherein a top one of the metal circuit layers includes power supply lands for connecting power supplies to a die, wherein a first plurality of the power supply lands have contiguous connection to the power supply plane formed by the top metal circuit layer, and wherein the laminated substrate has small-diameter blind vias between an inner one of the top two metal circuit layers and a second plurality of the power supply lands and large-diameter holes near edges thereof;
    plating a first plurality of the holes from the bottom of the substrate to the top metal circuit layer to form first large-diameter plated-through holes;
    plating a second plurality of the holes from the bottom of the substrate to the inner metal circuit layer to form second large-diameter plated-through holes;
    forming a plurality of small-diameter conductive vias proximate to and surrounding the holes; and providing terminals electrically connected to the bottoms of the first and second large-diameter plated-through holes to form power supply terminals of the substrate.

6. The method of claim 5, wherein the providing terminals comprises forming a metal circuit layer at the bottom of the substrate having jogs extending from the bottoms of the first and second plated-through holes to provide power supply lands.

7. The method of claim 5, wherein the top one of the metal circuit layers includes connected lands for attaching at least one first terminal of a decoupling capacitor and isolated lands for attaching at least one second terminal of the decoupling capacitor, and further comprising forming decoupling capacitor blind vias extending from the inner metal circuit layer to the isolated lands.

8. The method of claim 5, further comprising inserting conductive pins through the first and second large-diameter plated-through holes and electrically bonding the conductive pins to a corresponding one of the first or second plated-through holes.

9. A method of making an integrated circuit substrate, comprising:
 laminating a plurality of metal circuit layers between insulating layers, wherein a top two of the metal circuit layers are power supply planes, and wherein a top one of the metal circuit layers includes power supply lands for connecting power supplies to a die, connected lands for attaching at least one first terminal of a decoupling capacitor and isolated lands for attaching at least one second terminal of the decoupling capacitor, wherein a first plurality of the power supply lands have contiguous connection to the power supply plane formed by the top metal circuit layer;
 forming small-diameter blind vias between an inner one of the top two metal circuit layers and a second plurality of the power supply lands;
 forming large-diameter holes near edges of the substrate;
 forming decoupling capacitor blind vias extending from the inner metal circuit layer to the isolated lands;
 plating a first plurality of the holes from the bottom of the substrate to the top metal circuit layer to form first large-diameter plated-through holes;
 plating a second plurality of the holes from the bottom of the substrate to the inner metal circuit layer to form second large-diameter plated-through holes; and
 providing terminals electrically connected to the bottoms of the first and second large-diameter plated-through holes to form power supply terminals of the substrate.

10. The method of claim 9, wherein the providing terminals comprises forming a metal circuit layer at the bottom of the substrate having jogs extending from the bottoms of the first and second plated-through holes to provide power supply lands.

11. The method of claim 9, further comprising inserting conductive pins through the first and second large-diameter plated-through holes and electrically bonding the conductive pins to a corresponding one of the first or second plated-through holes.

12. A method of making an integrated circuit substrate, comprising:
 forming a laminated substrate having multiple metal circuit layers, wherein a top two of the metal circuit layers are power supply planes, wherein a top one of the metal circuit layers includes power supply lands for connecting power supplies to a die, connected lands for attaching at least one first terminal of a decoupling capacitor, and isolated lands for attaching at least one second terminal of the decoupling capacitor, wherein a first plurality of the power supply lands have contiguous connection to the power supply plane formed by the top metal circuit layer, and wherein the laminated substrate has small-diameter blind vias between an inner one of the top two metal circuit layers and a second plurality of the power supply lands and large-diameter holes near edges thereof, and decoupling capacitor blind vias extending from the inner metal circuit layer to the isolated lands;
 plating a first plurality of the holes from the bottom of the substrate to the top metal circuit layer to form first large-diameter plated-through holes;
 plating a second plurality of the holes from the bottom of the substrate to the inner metal circuit layer to form second large-diameter plated-through holes; and
 providing terminals electrically connected to the bottoms of the first and second large-diameter plated-through holes to form power supply terminals of the substrate.

13. The method of claim 12, wherein the providing terminals comprises forming a metal circuit layer at the bottom of the substrate having jogs extending from the bottoms of the first and second plated-through holes to provide power supply lands.

14. The method of claim 12, further comprising inserting conductive pins through the first and second large-diameter plated-through holes and electrically bonding the conductive pins to a corresponding one of the first or second plated-through holes.

* * * * *